(12) United States Patent
Sticherling

(10) Patent No.: US 10,692,912 B2
(45) Date of Patent: Jun. 23, 2020

(54) OPTICAL DEVICE FOR EXPOSURE OF A SENSOR DEVICE FOR A VEHICLE

(71) Applicant: Huf Hülsbeck & Fürst GmbH & Co. KG, Velbert (DE)

(72) Inventor: Nadine Sticherling, Essen (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 21 days.

(21) Appl. No.: 15/541,816

(22) PCT Filed: Jan. 6, 2016

(86) PCT No.: PCT/EP2016/050138
§ 371 (c)(1),
(2) Date: Jul. 6, 2017

(87) PCT Pub. No.: WO2016/110514
PCT Pub. Date: Jul. 14, 2016

(65) Prior Publication Data
US 2018/0012922 A1 Jan. 11, 2018

(30) Foreign Application Priority Data
Jan. 6, 2015 (DE) .................. 10 2015 100 069

(51) Int. Cl.
*H01L 27/146* (2006.01)
*B60W 30/08* (2012.01)
(Continued)

(52) U.S. Cl.
CPC ....... *H01L 27/14627* (2013.01); *B60W 30/08* (2013.01); *G02B 3/0056* (2013.01);
(Continued)

(58) Field of Classification Search
CPC ............ H01L 27/14627; H04N 5/2254; G02B 13/0085; G06K 9/209; G06K 9/00046
See application file for complete search history.

(56) References Cited

U.S. PATENT DOCUMENTS

2008/0142685 A1 6/2008 Gazeley
2012/0033079 A1* 2/2012 Karl .................. B60R 11/04
348/148
(Continued)

FOREIGN PATENT DOCUMENTS

| CN | 1947254 | 12/2010 |
| WO | WO 2008/025610 | 3/2008 |
| WO | WO 2016/110514 | 7/2016 |

OTHER PUBLICATIONS

Notification of Office Action and Search Report dated May 3, 2018 From the State Intellectual Property Office of the People's Republic of China Re. Application No. 201680003727.2 and Its Translation Into English. (16 Pages).
(Continued)

*Primary Examiner* — Thanh Luu

(57) ABSTRACT

The invention relates to an optical device (100) for exposure of a sensor device (10) for a vehicle (1) with an optical structure (101) which comprises an arrangement of optical micro elements (101.1) in order to bundle incident light (2) by the optical micro elements (101.1) and direct the light to sensor elements (10.1) of the sensor device (10) respectively, wherein the optical structure (101) is configured such that light (3) which is directed to the sensor element (10.1) can be concentrated for light active areas (10.2) of the sensor elements (10.1).

28 Claims, 5 Drawing Sheets

(51) Int. Cl.
*G02B 5/22* (2006.01)
*G02B 3/00* (2006.01)
*G06F 3/01* (2006.01)
*G06F 3/03* (2006.01)
*H04N 5/225* (2006.01)

(52) U.S. Cl.
CPC ............ *G02B 5/223* (2013.01); *G06F 3/017* (2013.01); *G06F 3/0304* (2013.01); *H04N 5/2252* (2013.01); *H04N 5/2254* (2013.01)

(56) References Cited

U.S. PATENT DOCUMENTS

| | | | |
|---|---|---|---|
| 2012/0038015 A1 | 2/2012 | Huang et al. | |
| 2012/0069181 A1* | 3/2012 | Xue | G01J 3/0229 348/148 |
| 2014/0267716 A1* | 9/2014 | Child | H04N 7/186 348/143 |
| 2014/0350836 A1* | 11/2014 | Stettner | G01S 17/023 701/301 |
| 2015/0260571 A1* | 9/2015 | Venkataraman | H03M 3/30 250/206 |
| 2015/0336521 A1* | 11/2015 | Tofilescu | B60R 16/023 382/104 |
| 2016/0003946 A1* | 1/2016 | Gilliland | G01S 17/10 356/5.01 |

OTHER PUBLICATIONS

International Search Report and the Written Opinion dated Apr. 21, 2016 From the International Searching Authority Re. Application No. PCT/EP2016/050138 and Its Translation of Search Report Into English. (21 Pages).

* cited by examiner

OPTICAL DEVICE FOR EXPOSURE OF A SENSOR DEVICE FOR A VEHICLE

RELATED APPLICATIONS

This application is a National Phase of PCT Patent Application No. PCT/EP2016/050138 having International filing date of Jan. 6, 2016, which claims the benefit of priority of German Patent Application No. 10 2015 100 069.5 filed on Jan. 6, 2015. The contents of the above applications are all incorporated by reference as if fully set forth herein in their entirety.

FIELD AND BACKGROUND OF THE INVENTION

The invention relates to an optical device for exposure of a sensor device for a vehicle according to claim 1. Further, the invention relates to a system with a sensor device for a vehicle according to claim 13 and to a method for exposure of such a sensor device for a vehicle according to claim 22.

It is known from the state of the art that sensor devices for image capturing and image reproduction are for example used in vehicles. Besides, for example sensor devices or sensor systems are used for monitoring of a detection area outside the vehicle in order to detect the presence of a user and/or gestures of the user. In dependence of a detected approaching and/or gesture for example a function at the vehicle is performed like for example an authentication. By such sensor devices the image reproduction is not paramount for the user of a vehicle.

Disadvantageously with the known solutions that with unfavorable light conditions a detection is more complicated or not possible. Hereby, the risk of an error detection or an error interpretation of the gesture or the approaching increases due to the sensor device. Further, for the use of the sensor device often a high energy consumption (meaning power and/or voltage consumption) is necessary in order to increase the sensitivity. Likewise, due to an erroneous detection the energy consumption is increased and the reaction time is decreased. An increase of the light sensitivity further requires a complex configuration with possibly expensive components for the sensor device or the sensor system like for example the use of greater pixels or the use of illumination elements.

SUMMARY OF THE INVENTION

It is therefore the object of the present invention to at least partially avoid the previously described disadvantages. Particularly, it is object of the present invention to increase the reliability of a detection, to improve the gesture recognition, to decrease the energy consumption of the sensor device and/or to reduce the costs for the sensor device or the sensor system.

The previous object is solved by an optical device with the features of claim 1, a system with the features of claim 13 and a mounting module for a vehicle and with a method with the features of claim 21. Further, features and details of the invention result from the respective dependent claims, the description and the drawings. Thereby, features and details which are described in connection with the method according to the invention naturally also apply in relation to the optical device according to the invention, the mounting module according to the invention and the system according to the invention and vice versa such that according to the disclosure of the single aspects of the invention it can always be reciprocally related to.

Subject matter of the invention is an optical device for exposure of a sensor device, wherein the sensor device is preferably used for vehicle and/or for the recognition of gestures of a person like a user (of the vehicle). The term "exposure" thereby relates to the fact that the optical device directs or transfers incident light to the sensor device meaning particularly light reaching the optical device. This occurs preferably by the fact that the optical device can alter the light part and/or the direction of the incident light meaning that the incident light is altered or deflected. The emitting light or the emitting light beam is thereby altered by the optical device to the corresponding incident light or incident light beam in relation to the spreading direction for example deflected and/or bundled. The subsequently emitting or escaping light is thereby directed to the sensor device, wherein a focused exposure of the sensor device occurs.

Thereby, it can be preferably intended that the optical device comprises an optical structure, which comprises an assembly of optical micro elements, particularly micro lenses in order to bundle incident light by the optical micro elements and respectively direct these to the sensor elements of the sensor device, wherein the optical structure is configured such that light directed to the sensor elements can be concentrated for light active areas of the sensor elements. Hereby, the advantage is achieved that a greater light amount can be used for the image recognition of the sensor device. Normally, meaning particularly without alteration of the light paths of the incident light by the optical device, light active and light inactive areas of the sensor device are exposed to a similar extent. The exposed area of the sensor elements which does not comprise light active areas therewith configures the light inactive area, which cannot be used for the image acquisition (by action of light) and comprise for example cable, electronic and/or a substrate. The smaller the area of the exposed light active area is in relation to the exposed light inactive area the smaller is the filling factor and the smaller is the light sensitivity of the sensor device. The filling factor is thereby particularly existent by the relation of the area of the light sensitive light active area to the (exposed) whole area of the sensor device. By the alteration of the light path of the incident light (meaning for example by bundling the light) by the optical structure the filling factor of the sensor device is increased and the light sensitivity of the sensor device is significantly improved. Therewith, also the energy consumption can be reduced since for example less image recordings have to be performed by the sensor device.

Further, it is possible that the sensor device for a vehicle particularly a motor vehicle, passenger car, truck and/or motor bike is suitable particularly for the surveillance of an outer area of the vehicle. The area surveyed from the sensor device thereby configures at least one detection area. Thereby, at least a sensor device with at least one optical device in the lateral area of the vehicle (for example at the B-pillar of the vehicle) can be assembled in the rear part and/or the front part of the motor vehicle. Hereby, multiple detection areas are configured, which comprise outer areas for the different sides or directions of the vehicle. Therewith, an approaching and/or movement of a user and/or a gesture of different directions at the vehicle can be recognized.

According to a further possibility it can be intended that the optical micro elements are configured as micro lenses and/or the optical structure is configured as a micro lens array and/or the micro elements are assembled in a matrix manner. Thereby, a transition of the incident light from the outer medium (for example air) into the micro elements occurs, wherein particularly due to the refraction index of the micro elements a light refraction and/or deflection of the incident light occurs with this transition. The micro elements are thereby particularly refractive optical elements with a refractive index which differs from the refractive index of the outer medium. Preferably, with the emission of the (emitting and directed to the sensor element) light from the micro elements a further transition of the light from the micro elements into the outer medium (for example air) or a further medium occurs, particularly the sensor device or the sensor elements (with a likewise different refraction index). The optical structure can be configured matrices-like, particularly rectangular or squared and comprise a line count of 10 or 20 or 30 or maximum 40 micro elements and a number of columns of 10 or 20 or 30 or maximum 40 micro elements.

It is further possible that the micro elements are configured from an amorphous material and/or plastic and/or polycarbonate and/or acryl and/or technical polyester and/or cyclo-olefin-copolymers (COC) and/or a hybrid polymer. The plastic is preferably configured heat-stabilized and/or UV-stabilized. Polyester, particularly polycarbonate, thereby provides the advantage that highly transparent and colorless micro elements can be configured which comprise a good form stability. By the use of a lacquer, particularly in form of a coating, and/or doping with a dye further the UV-stability can be increased and the filter properties of the micro elements as optical filters can be determined. The UV-stability can be further increased by a combination with polyurethanes. Cyclo-Olefin-Copolymers further advantageously comprise a very low double refraction. Particularly, the micro elements or the material of the micro elements comprise for example a transmission factor of mainly 80% to 99%, preferably 92%, particularly in the infra-red- and/or near infra-red area. Further, the micro elements or the material of the micro elements can comprise a refraction index between mainly 1.4 to 4, preferably in the area of 1.5 or 3.1 particularly with the wavelength of 633 nm and/or in the infra-red- and/or near-infra-red area. Further, the micro elements can comprise an numeric aperture of 0.01 to 1, preferably 0.5 to 0.85 and/or greater than 0.7 and a diameter in the area of 1 µm to 5 mm, particularly 10 µm to 800 µm and preferably in the area of 40 µm to 200 µm and/or a focal length of 0.3 mm to 60 mm. Further, the micro elements can be configured as micro lenses with a mainly spherical and cylindrical or plano-convex or biconvex or aspherical or parabolic geometry and a center thickness of 0.1 to 1.5 mm. Hereby, the optical properties of the optical device can be optimally adjusted to the sensor device. The micro lenses are preferably assembled adjacent in even distances and effect an optimal separation of the incident light in partial beams, which are directed to light active areas of the sensor elements. The whole optical structure can thereby preferably comprise a width of maximum 10 mm to a length of 10 mm. The radius of curvature of the single micro elements particularly micro lenses can for example be in an area of 1 mm to 30 mm particularly in an area of 10 mm to 15 mm. The divergence angle of the micro elements is for example ±0.5° to ±2.5°. The lens distance or distance of the micro elements is for example 40 µm to 300 µm. The filling factor of the optical structure particularly of the micro lens arrays preferably is mainly 100%, particularly at least 90% and/or 95%. The area of the optical structure between the adjacently assembled micro elements can further be coated and/or modified in a way that light is absorbed and/or reflected. Hereby, an increase of contrast can be achieved.

In a further possibility it can be provided that an optical filter is intended for the selection of incident light in dependence of the wavelength. Due to the optical structure incident light is concentrated to the light active areas of the sensor elements and the filling factor is improved. However, it can be existent that under certain conditions for example by day too much light hits the sensor device and is particularly concentrated to the light active area. Hereby, for example an over exposure results and/or the technical evaluation of the image information is made difficult since undesired light dominates the image acquisition. In order to solve this problem an optical filter can be used, which filters undesired light (for example by absorption and/or destructive interference and/or reflection of the undesired light). The undesired light is thereby particularly light in a certain undesired spectral area (for example visible light in the wavelength area of approx. 380 nm to 780 nm) and/or light outside a certain desired light spectral area (for example light outside the infra-red area), which is detectable by the sensor device. Preferably a filtering of the undesired light for different wavelengths of the undesired spectral area occurs not always with the same intensity however such that the optical filter for the light relevant for the image acquisition (the undesired light in the desired spectral area, for example in the infra-red-area) comprises a significantly higher transmission factor than for the undesired light.

Further, it is possible that the optical filter in the optical structure is particularly integrated into the micro elements. The arrangement of the separated filter elements, which is for example configured as a glass plate can comprise the disadvantage that the mounting and/or calibrating is possibly made difficult and a greater amount of space is necessary. The integration of the optical filter in and/or at the optical structure thereby enables the configuration of a very compact and space saving and cost efficient optical device. Hereby, further the reliability and safety is increased since no separate constructional distinct filter has to be intended. Thereby, the optical filter can be configured monolithic and/or from one piece with an optical structure and therewith the optical device according to the invention can configure an (integral) component. The optical filter can therewith preferably be configured by the micro elements itself. The optical device according to the invention can be particularly configured monolithic and/or in one piece with the sensor device and/or integrated into the sensor device. Hereby, the compactness particularly of a system according to the invention, which comprises the optical device according to the invention and the sensor device can be further increased.

Further, it can be an advantage within the scope of the invention that an optical filter is intended for filtering pre-defined wavelengths of the incident light, wherein the optical filter particularly is configured as an infra-red filter in order to preferably block visible light. As infra-red area thereby particularly light (meaning electromagnetic radiation) is identified in a wavelength area of approx. 700 nm (or 780 nm) to 1 mm, preferably from 830 nm to 10 µm and/or from 780 nm to 10 µm. As near-infra-red or near infra-red particularly the wavelength area of 700 nm or 780 nm (which is particularly adjacent to the visible light area) to 1,100 nm of the light. As visible wavelength area particularly the for the eye visible part of the electromagnetic radiation and preferably the wavelength area between 380 nm to 700 nm (or 780 nm to 800 nm) is determined. Thereby, it is dependent on the intended purpose of the sensor device which spectral area of the light is relevant for the image recognition. Hereby, surprisingly it has been shown that light in the infra-red area, particularly in the near infra-red area, enables a particularly reliable recognition of gestures of a user for the outer area of the vehicle.

Further, within the scope of the invention it can be intended that an optical filter at and/or in the optical structure is intended and particularly configured such that the light directed to the sensor elements is mainly free from visible light. The visible light is thereby for example suppressed such that the intensity of the visible light, which is directed to the sensor device (meaning the filtered light) is reduced to maximal 80% or 50% or 30% or 10% of the intensity of the incident visible light. The incident visible light is thereby particularly visible light, which is reflected from an object (like a user) in the detection area and hits the optical device. Hereby the undesired visible light is efficiently reduced.

A further advantage within the scope of the invention can be achieved when the optical structure, particularly the micro elements are configured as optical filters and particularly comprise a material for filtering and/or are doped with a material for filtering, which preferably absorbs visible light. Therewith the advantage is achieved that the micro elements can be used at the same time as refractive elements (for example as a micro lens) and as an optical filter. Hereby, a compact construction and a cost efficient production result. The material can for example be a dye, particularly a synthetic dye, which for example absorbs visible light for at least 10% or 30% or 50% or 80%. The material is particularly introduced into the optical filter by doping and/or by injection molding, particularly to the optical structure and to the micro elements.

Further, within the scope of the invention it is possible that the micro elements comprise layers particularly di-electric and/or metallic layers. By coating the functionality of the micro elements can be expanded. Thus, for example the micro elements can comprise a (particularly metallic) layer, which is configured such that the reduction of the reflection can be particularly effected by a wavelength dependent constructive and a wavelength dependent destructive interference. Likewise, multiple such layers can be intended and can therewith configure an anti-reflection coating. The surface reflection is hereby preferably reduced to below 5% and/or 2% and/or 1% in the (near-) infra-red area. Further, it is possible that the micro elements comprise at least one di-electric layer, which is particularly configured as an interference filter for the wavelength dependent filtering of light. Thereby, the filtering of undesired light by the interference filter can for example occur effecting that wavelength dependent destructive and constructive interference. The optical filter can thereby comprise an interference filter (meaning by at least one layer configured on the micro elements) and/or an absorption filter (for example by absorbed dyes in the micro elements). Beside the combination of different filter types it can be further intended that the optical filter comprises only an interference filter and/or only an absorbance filter.

In a further possibility it can be intended that at least 10×10 (meaning in total 100 micro elements and/or 10 columns and 10 lines) and/or 20×20 (meaning in total 400 micro elements and/or 20 columns and 20 lines) and/or 30×30 (meaning in total 900 micro elements and/or 30 columns and 30 lines) and/or 50×50 (meaning in total 2500 micro elements and/or 50 columns and 50 lines) micro elements particularly in a matrix arrangement can be arranged in the optical structure and particularly assignable to a corresponding arrangement of sensor elements. Thereby, the assignment can for example occur 1:1 such that each micro element is assigned to exactly one sensor element. Further, the assignment can occur for example 1:2 such that each micro element is assigned to exactly two sensor elements and/or 1:5 or 1:10 or occur in any other constant ratio. In order to achieve this pre-defined ratio it can be intended that multiple optical structures (particularly micro lens arrays) are assembled adjacent particularly matrix-like. Hereby, the filling factor of the sensor device is efficiently improved and the light sensitivity for the sensor elements particularly pixels is evenly increased.

Further, it is possible within the scope of the invention that the micro elements are configured from plastic. The plastic can for example be configured in infra-red translucent and/or partial transparent and/or vanished plastic. Thereby, it can be intended that the refraction index of the plastic is between 1.4 and 1.6 in order to achieve an optimal focus of the sensor elements.

It is further possible that the micro elements comprise acryl and/or polycarbonate and/or epoxide resin and/or quartz glass and/or gallium phosphide and/or gallium arsenide. Thereby, the micro elements can be configured for example as acryl glass (meaning polymethyl methacrylate) or from polycarbot, wherein hereby a particularly good transmissivity in the infra-red-area results. Thereby, such a color recipe of the micro elements can be intended that a non-transmissibility in the (whole) visible light area and transmissibility for the (near-) infra-red light is enabled. Epoxide resin further has a good temperature resistance, germanium comprises a particularly good transparency in the infra-red area. With the use of gallium phosphide a particularly advantageous transmission in the infra-red area can be achieved, wherein the micro elements can comprise a refraction index of at least 3.

For a further advantage it can be intended that the carrier, particularly a support element, is intended in order to at least position single micro elements and/or the optical structure and/or to arrange at the sensor device. The carrier thereby serves preferably for supporting and/or for the temperature independent positioning of the micro elements and/or the optical structure. Thereby, the carrier can comprise a configuration such that with a heat extension of the carrier the optical structure remains fixed at the same position. Particularly, the carrier and/or a compensation element of the carrier comprise a structure, which directs a heat extension in different directions and thereby compensates the same. The carrier further enables for example a detachable or fixed arrangement of the optical structure at the substrate and/or at the sensor device. Thereby, the carrier is for example arranged on one side or both sides (for example at opposing sides) or at each side of the sensor device or the optical structure. The substrate comprises for example glass and/or silicium.

Preferably, it can be intended with the invention that a carrier, particularly a supporting element, comprises at least a compensation element, which is configured at the optical structure such that a heat extension of a carrier and/or the support element is compensated, wherein particularly the optical structure with the heat extension of the carrier remains at a mainly same position by the carrier. This is preferably achieved thereby that at least a compensation element of the carrier comprises an angled structure, which is preferably configured such that a heat extension in a first direction of a first structure of the compensation element is balanced due to a heat extension in a particularly opposing second direction of a second structure of the compensation elements. Hereby, even with different operating conditions an optimal image acquisition is ensured.

Likewise subject matter of the invention is a system with a sensor device for a vehicle, particularly motor vehicle, and at least an optical device for exposure of the sensor device. Thereby, it is preferably intended that the optical device comprises an optical structure, which comprises an arrangement of optical micro elements in order to bundle incident light by the optical micro elements and direct it to the sensor elements of the sensor device, wherein the optical structure is configured such that light directed to the sensor elements can be concentrated for light active areas of the sensor elements. Preferably for the system according to the invention an optical device according to the invention can be used. Thereby, the system according to the invention provides the same advantages like they are described in detail in relation to the optical device according to the invention.

It is further possible that the optical structure configures a unit with the sensor device and/or is integrated on the sensor device and is arranged preferably relative to the sensor device such that incident light from the outside is directed to the optical structure and through the optical structure to the sensor elements. As "outside" in this relation the area from which light shines from the detection area into the optical device has to be understood. Thereby, it is possible that the system according to the invention or the optical device comprises an opening and/or aperture through which incident light from outside reaches the optical structure. Further, preferably the optical structure configures a constructional unit particularly from one piece with the sensor device such that an assembly is significantly simplified. The optical structure can thereby be preferably detachably or connected fixed to the sensor device for example by soldering.

It can be an advantage when within the scope of the invention the sensor device is an image acquisition device and/or an image sensor, wherein the sensor elements are configured as photo sensitive pixels and/or as a matrix and/or assembled adjacent to one another. The sensor device can thereby for example comprise a resolution of at least 10×10 and/or 20×20 and/or 30×30 and/or 50×50 and/or 100×100 and/or 200×200 pixels, wherein the pixels are particularly arranged matrix-like and preferably squared. Further, the sensor device can comprise a light sensitivity (particularly completely) in the visible spectral area of the light and at least partially in the infra-red area. Preferably, the sensor device can be configured to perform time-of-flight recordings and therewith measure the duration of the (emitted and reflected) light. Hereby, the sensor device can be connected via a control and/or evaluation device with the light source, particularly a pulse-laser. Further, the sensor device can be time controlled for example from the control and/or evaluation unit.

Preferably, within the scope of the invention it can be intended that the sensor elements particularly the pixels comprise a light active area and a light inactive area, wherein only the light active area is configured photo sensitive and/or can be used for image acquisition. Thereby, the light active area can comprise for example photodiodes and therewith directly interact with the incident light beams and serve for image acquisition. The light inactive areas however comprise for example electric cables or electronics or the substrate such that incident light is not used for image acquisition. The light inactive areas are therefore necessary in order to enable an electronic functionality and an electronic readout of the pixels. The sensor device can thereby be configured as a one dimensional line sensor or as a two dimensional sensor with color sensitive or monochrome pixels.

Likewise within the scope of the invention it can be intended that the sensor device is configured as a CMOS (complementary metal-oxide-semiconductor) sensor and/or as a CCD (charge-coupled device) sensor and/or as a LDPD (Lateral Drift Field Photodetector) sensor. The LDPD sensor is for example described in reference DE 10 2009 020 218 B3 and can be read out particularly fast. The CMOS sensor further comprises an uncomplicated cost efficient construction. The CCD sensor is preferably configured light sensitive. Particularly the sensor device is configured such that the light sensitivity in the near infra-red area corresponds at least 80% and/or 90% and/or 100% of the light sensitivity in the visible area. Thereby, the sensor device comprises preferably pixels, which transform light into electricity.

It is further possible within the scope of the invention that the sensor device is connected electrically with a control and evaluation device and particularly controllable clocked such that time-of-light recordings (meaning measuring the radiated light) are performable. Thereby, for measuring the radiated light for example a light source is used in order to emit a light pulse. The light pulse illuminates for example the detection area and is reflected from objects like the user (reflected and/or scattered). Subsequently, the reflected light reaches for example the optical device and is directed to the sensor device. Based on the time between the emission of the light pulse and the detection by the sensor device the distance of the object can be evaluated. Thereby, the detection occurs time controlled. The timed control thereby occurs preferably synchronous with the pulsed control of the light source of the system according to the invention, particularly a pulse laser or an LED. Thereby, the light source is preferably configured as an infra-red light source and comprises for example an electric shutter or at least two switches which are controlled in time dependency from the light source. Thereby, the light determined and synchronized control of the light source and/or the sensor device by particularly a common modulation source (meaning for example the control and/or evaluation device) a recognition of the radiated light and therewith a distance detection is possible. Thereby, for example frame rates of at least one picture per second or at least 3 pictures per second or at least 5 pictures per second or at least 10 pictures per second or at least 20 pictures per second or at least 40 pictures per second or at least 80 pictures per second or at least 160 pictures per second are used. Preferably, thereby particularly each single of these pictures is from at least 15 or at least 30 or at least 40 or at least 50 or 20 to 1000, preferably 40 to 60, particularly 200 single exposures or accumulations. Further, it can be intended that for the respective single exposures and/or accumulation an exposure with a recording time (exposure duration) of 6 to 100 ns (nano seconds), preferably 10 to 50 ns, particularly at least 30 ns is performed. For the performance of the control (of the sensor device) and/or recording of the single exposures for example an impulse generator can be used. Further, it can be intended that the sensor device and/or the frame rate and/or the exposure duration and/or the control are surveyed by a surveillance unit of the control and/or evaluation device, wherein preferably hereby the control and/or the impulse and/or the time response and/or the energy supply of the sensor device are surveyed and/or regulated and/or controlled and/or synchronized. Hereby, for example an approaching of the user or gestures can be reliably detected.

It can be further intended that at least one light source for the emission of at least light pulses or a continuous emission and an optical filter of the optical device is intended, wherein the filter properties of the optical filter are adjusted to the wavelength of the emitted light from the light source. In order to enable an efficient gesture recognition and/or time-of-light measurement thereby particularly an infra-red source is intended, wherein the filter is adjusted to the spectral area of the emitted light.

Further, a method for exposure of a sensor device for a vehicle with an optical device is subject matter of the invention. Thereby, it can be intended that an optical structure of the optical device comprises an arrangement of optical micro elements and incident light is bundled by the optical micro elements and is respectively directed to sensor elements of the sensor device, wherein by the optical structure the light directed to the sensor elements is concentrated for light active areas of the sensor element. Further, it can be intended that an optical device according to the invention and/or a system according to the invention is used for the method according to the invention. Thereby, a method according to the invention provides the same advantages like they are described in detail in relation to the system according to the invention and/or an optical device according to the invention.

Particularly, it is possible that the incident light swing into the optical device initially reaches through an optical filter, is then manipulated by the micro elements and subsequently directed by the micro elements to the sensor elements. The manipulation of light occurs particularly by deflection such that the light is concentrated to light active areas of the sensor elements. Thereby, it can be intended that the micro elements are configured such that the farther from the center point of the micro elements the light beam passes, the more it is refracted and deflected such that incident light is bundled and concentrated from each micro element.

Further, it can be intended that a filtering of the incident light occurs by an optical filter, wavelength dependent by absorption and/or reflection. Hereby, the optical filter can for example comprise dyes, which enable an absorption of a certain undesired spectral area of the light. The dyes can for example be introduced in one or multiple layers of the micro elements or within the micro elements. The reflection of the undesired spectral area of the light occurs for example by at least an interference filter, which is configured by layers at and/or in the micro elements. Hereby, a reliable filtering of the undesired light area (particularly of the visible light) is enabled.

It is further possible that the micro elements bundle incident light and direct and/or focus the same to the respective certain areas of the sensor device particularly to light active areas of the sensor elements such that the exposure of light inactivated areas is reduced. The micro elements are therewith particularly configured as micro lenses, wherein the bundling of light occurs due to different refraction indexes of the micro lenses to the outer area. Hereby, the light sensitivity of the sensor and the luminous efficiency can be increased. The filling factor and the photo sensitivity are hereby increased by at least the 1.5-fold, 2-fold and/or 3-fold.

Further, it can be intended within the scope of the invention that a control and/or evaluation device is provided, wherein the control and/or evaluation device controls the sensor device and/or a light source pulsed for a performance of time of flight recordings. The pulsed operation of the sensor device is thereby a time dependent operation, wherein the sensor device is time dependently switched sensitive for example by electronic switches. A light pulse has hereby for example the duration 30 ns to 300 ns. A control and/or evaluation device thereby serves particularly as modulation source for the time dependent control and can alternatively or additionally comprise an evaluation electronic. The evaluation electronic comprises for example a microprocessor and/or a digital signal processor and can for example determine the radiated light based on the measured image information of the sensor device in dependence from the control of the light source. Further, it is possible that the control and/or evaluation device affects a gesture recognition due to an image information of the sensor device. Hereby, for example a pattern recognition is performed. Thereby for example algorithms like a static pattern recognition, like support vector machines or neuronal nets can be used.

It is further possible that by the sensor device a detection area is located outside the vehicle in order to determine a vicinity and/or gesture of a user, wherein in case of a detection of the vicinity and/or gesture a function of the vehicle is triggered. Such a function can for example be an identification control which for example is performed within the scope of a passive and/or active keyless entry system. Thus it is for example possible that with the recognition of a certain gesture a wake-up signal in an identification device which the user has for example on hand is transmitted. The identification device receives the wake-up signal and transmits a code to the vehicle. A further function can for example be the opening of the hatch flap and/or the opening of doors of the vehicle. Thereby, for example it can be intended that a recognition of a first gesture controls a first function and with the recognition of a second gesture a second function is controlled.

It is further possible that for the image acquisition of the sensor device a control and/or evaluation unit is intended which combines a number of image acquisitions of the sensor device for the evaluation dependent of the amount of light. Thereby, the control and/or evaluation device can serve for an improvement of the image acquisition, wherein by the evaluation electronic for example multiple image acquisitions are averaged and/or integrated. Thereby, it is necessary that the sensor device performs multiple image acquisitions which are subsequently combined to a recording.

Further, a mounting module with an optical device and a sensor device for a vehicle are subject matter of the invention. Thereby, it is preferably intended that the optical device comprises an optical structure which comprises an arrangement of optical micro elements in order to bundle incident light by the optical micro elements and respectively direct the sensor elements of the sensor device, wherein the optical structure is configured such that light directed to the sensor elements is concentrated for the light active area of the sensor elements. Further, it can be intended that the optical device according to the invention and/or the system according to the invention and/or the method according to the invention are used for the mounting module according to the invention. Thereby, a mounting module according to the invention comprises the same advantages like they are described in detail in relation to the system according to the invention and/or an optical device according to the invention and/or a method according to the invention.

It is further possible that the system according to the invention and/or the mounting module according to the invention comprise a housing and is particularly manually arrangeable with the housing at the vehicle such that the outer area of the vehicle can be surveyed by the sensor device. Further, the mounting module can be configured such that it is installed in the motor vehicle in a way that a detection area of the sensor device extends at least partially in the outer area of the vehicle. Hereby, an optimal recognition of objects like a user is possible. The housing can for example be configured such that it is assembled at the B-pillar of the vehicle and/or at the rear area and/or at the emblem of the vehicle. The system according to the invention and/or the mounting module according to the invention thereby comprises beneath a sensor device and an optical device for example also the light source and/or the control and/or evaluation device which are preferably assembled protected (for example from weather influences within the housing). Thereby, the housing comprises an opening through which incident light can be introduced and hit the optical device.

BRIEF DESCRIPTION OF THE SEVERAL VIEWS OF THE DRAWINGS

Further advantages, features and details of the invention result from the subsequent description in which embodiments of the invention are described in detail with relation to the drawings. Thereby, the features described in the claims and in the description can be essential for the invention each single for themselves or in any combination. It is shown:

In the subsequent figures for the same technical features even from different embodiments identical reference signs are used.

DESCRIPTION OF SPECIFIC EMBODIMENTS OF THE INVENTION

Figure 1:
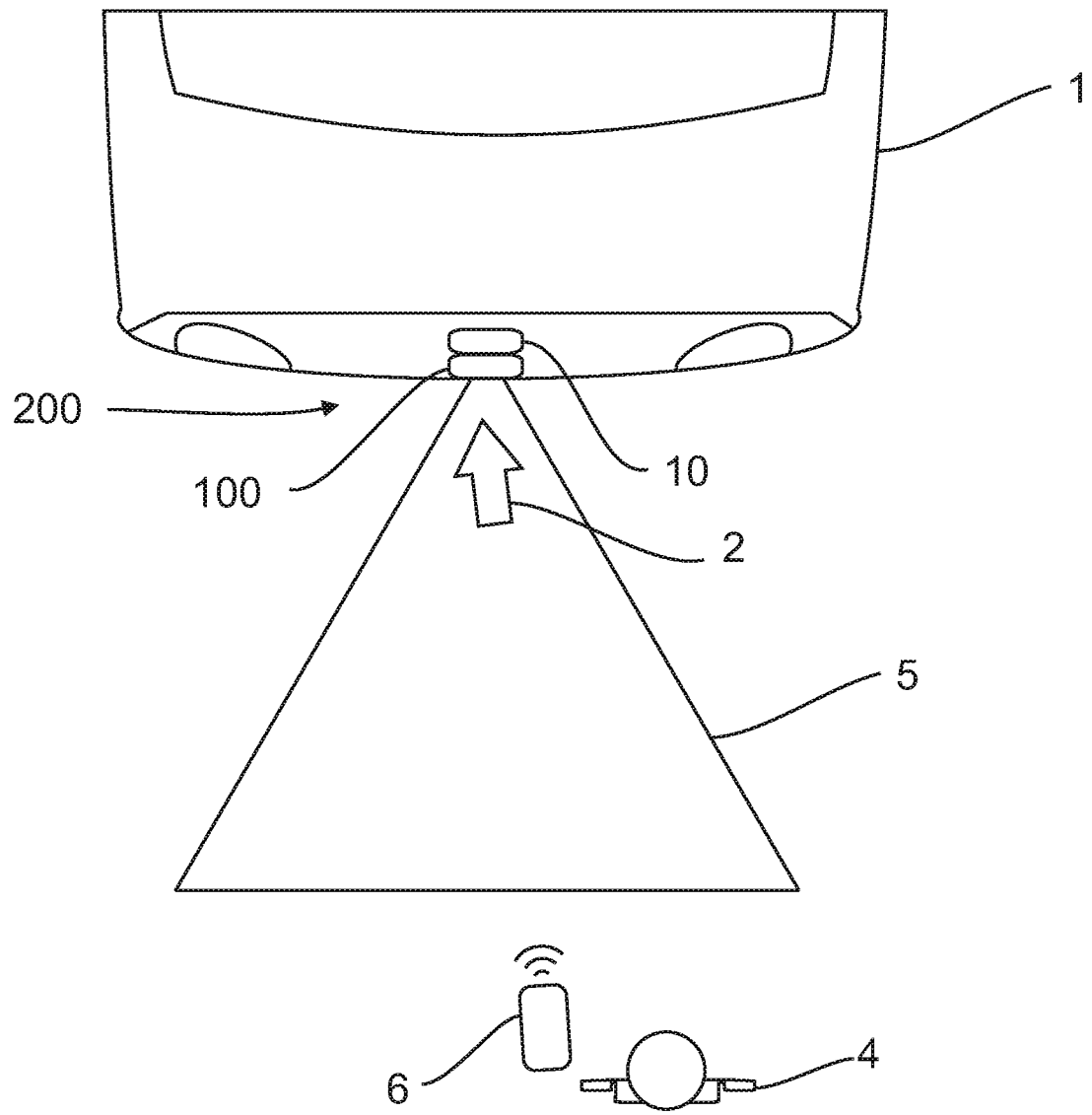
FIG. 1 a top view of the rear area of the vehicle with an optical device according to the invention, FIG. 2 a view of an optical device according to the invention which is arranged at the lateral area of the vehicle, FIG. 3 a representation of a construction of an optical device according to the invention and a system according to the invention, FIG. 4 a representation of a configuration of an optical device according to the invention and a system according to the invention, FIG. 5 an enlarged schematic representation of a sensor device, FIG. 6 a schematic representation of a functionality of a device according to the invention and a construction of the system according to the invention, FIG. 7 a schematic representation of the construction of an optical device according to the invention, FIG. 8 a further schematic representation of the construction of an optical device according to the invention, FIG. 9 a further schematic representation of the construction of an optical device according to the invention, FIG. 10 a further schematic representation of a construction of an optical device according to the invention, FIG. 11 a view of an optical device according to the invention, a system according to the invention and a mounting module according to the invention and FIG. 12 a schematic representation for visualizing the method steps of the method according to the invention.

In FIG. 1 a top view of the rear area of the vehicle 1 is shown, wherein at the rear area of the vehicle 1 a system 200 according to the invention with an optical device 100 according to the invention and a sensor device 10 is arranged. The system 200 according to the invention is thereby arranged at the outer area of the vehicle 1 such that a monitoring of the detection area 5 outside the vehicle 1 is enabled by the sensor device 10. Hereby, the system 200 according to the invention and/or the optical device 100 comprises an opening or an aperture which is arranged at the vehicle 1 such that light from the detection area 5 can reach through the optical device 100 according to the invention as incident light 2. The incident light 2 is thereby deflected by the optical device 100 according to the invention or the light path is modified such that light is directed to the sensor elements 10.1 of the sensor device 10. The incident light 2 is thereby particularly light information which results from an object in a detection area 5 like a user 4. Thereby, for example daylight and/or light of a light source 7 is reflected from objects like the user 4. By the acquisition of the radiated light with the use of a light source 7 for example by time-of-flight measurements a distance detection is enabled. The recording and the comparison of multiple pictures by the sensor device 10 further enable the recognition and evaluation of gestures of the user 4. Thereby, it is possible that the image acquisition by the sensor device 10 is initiated by an approaching of the user 4 and/or by the detection of an identification device 6. In dependence of an evaluation of the recorded image information like for example a recognized gesture or a recognized movement pattern a function of the vehicle 1 can be activated. Such a function is for example an authentication process, wherein for example a wake-up signal is transferred through the identification device 6 via a radio connection and/or an exchange of security codes occurs wireless with the identification device 6.

Figure 2:
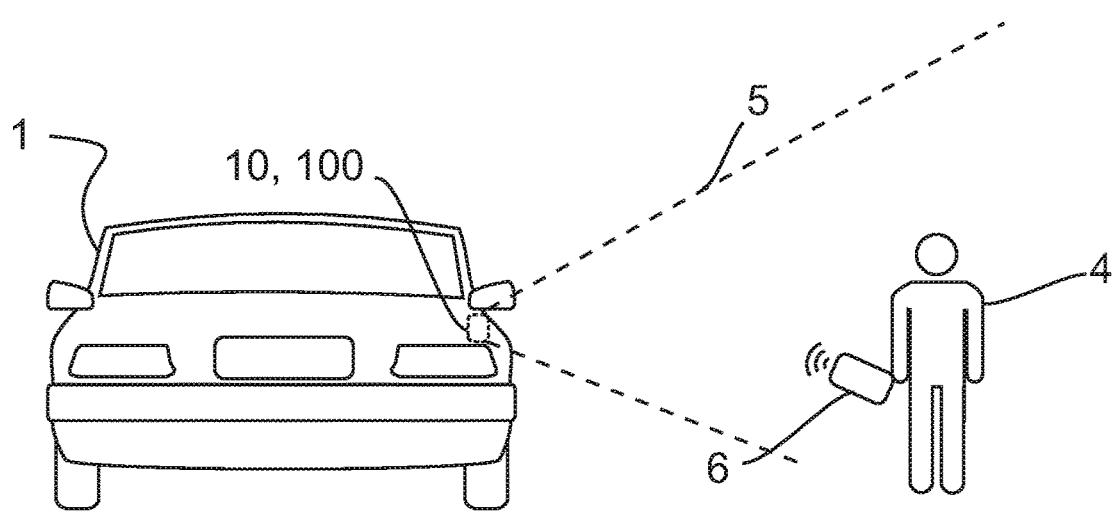

FIG. 2 shows a rear view of a vehicle 1 with the sensor device 10 and an optical device 100 according to the invention. The optical device 100 according to the invention can for example be arranged at the B-pillar of the vehicle 1 and comprises at least one opening to the outer area of the vehicle 1. It is possible that in dependence of the optical device 100 a maximum image angle is predetermined which determines the extension of the detection area 5. Further it can be possible that multiple optical devices 100 according to the invention and/or multiple systems according to the invention are intended at the vehicle 1. Thus, for example according to FIG. 1 a system 200 according to the invention or an optical device 100 according to the invention can be arranged at the rear area of the vehicle 1 and the further optical device 100 according to the invention or a further system 200 according to the invention can be arranged at each lateral area of the vehicle. Hereby, the advantage is achieved that a detection of an approaching and/or gesture of the user 4 from each side of the vehicle 1 is possible.

Figure 3:
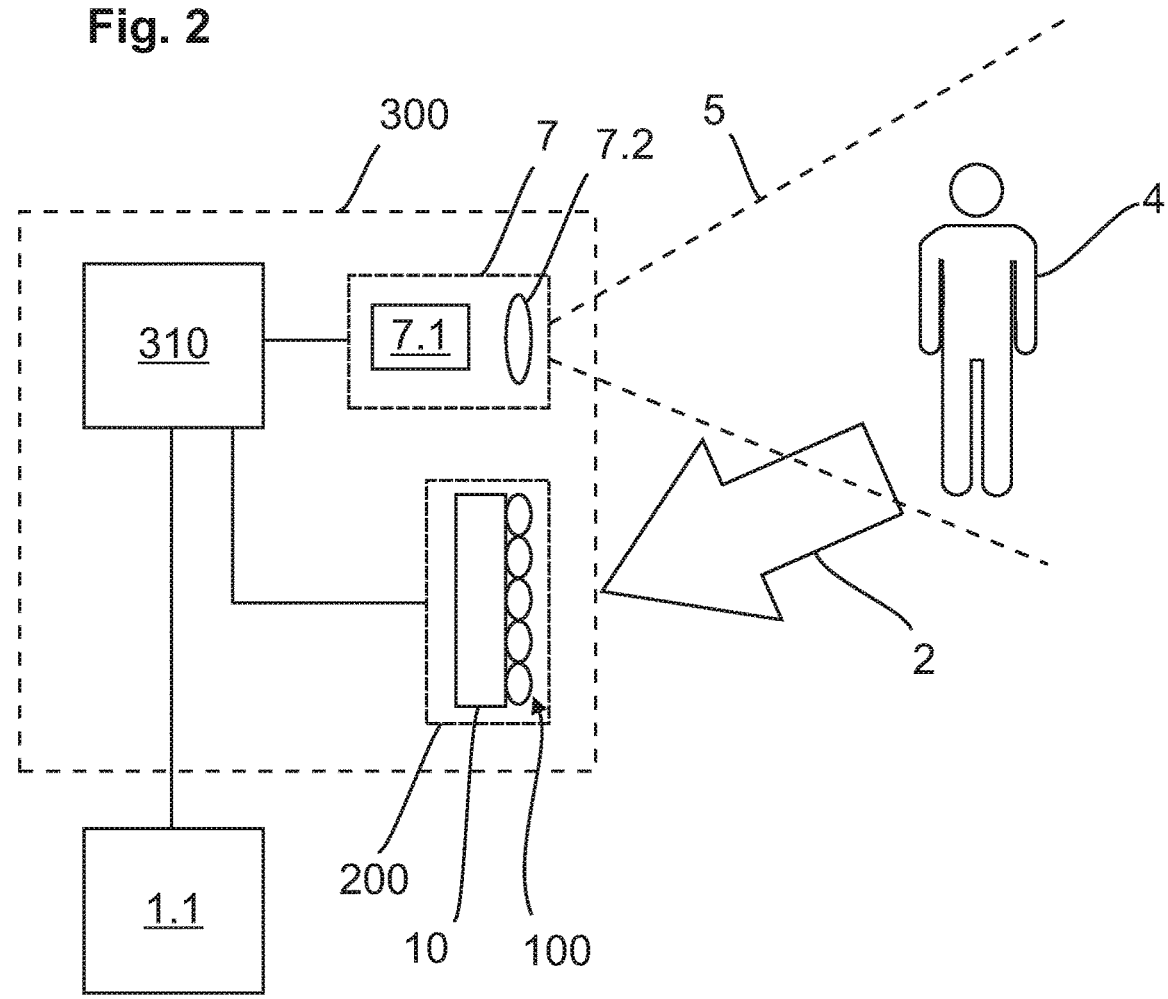

In FIG. 3 schematically the construction of a system 200 according to the invention is shown. Thereby, it can be intended that the system 200 according to the invention is part of the mounting module 300 according to the invention. The mounting module 300 is thereby configured such that a simple arrangement at the vehicle 1 for example in an intended acceptance of the vehicle 1 is possible. Hereby, the mounting module 300 for example comprises a housing in which an optical device 100 according to the invention is arranged with a sensor device 10 and/or light source 7 and/or a control and/or evaluation unit 310. Further, the mounting module 300 according to the invention can be arranged by screwing, clipsing or by a detachable arrangement and/or form- and/or force fittingly at the vehicle 1 or in an intended acceptance. Likewise the mounting module 300 according to the invention can comprise electric contacting means like for example a plug connection in order to configure an electric connection with the vehicle 1 or with a vehicle electronic of the vehicle 1 for the power supply and/or data connection. The control and/or evaluation unit 310 further preferably comprises an electronic like a microprocessor and/or a microcontroller and/or an FPGA (field-programmable gate array) and/or a data storage. Further, it is possible that the control and/or evaluation unit 310 comprises a bus adapter like for example a CAN bus adapter for the data connection with the vehicle electronic and/or digital signal processor for the processing of the light and image information. The vehicle electronic of the vehicle 1 can thereby particularly comprise a control electronic 1.1 which for example initiates transferred information of an authentication process or a further function of the vehicle 1 due to the control and/or evaluation unit 310. In FIG. 3 it can be recognized that the control and/or evaluation unit 310 is connected electronically or electrically with a system 200 according to the invention particularly with the sensor device 10 and/or with the light source 7 particularly with a not shown electronic of the light source 7 for the control of a laser diode 7.1. Thereby, the control and/or evaluation unit 310 preferably controls a pulsed and/or intermittent operation of the light source 7 and/or sensor device 10. For example a light beam and a light pulse are generated by the light source 7, subsequently widened by a widening optic 7.2 for the exposure of a detection area 5 and emitted into the detection area 5. The emitted light is reflected from objects in the detection area 5 like the user 4 and hits at least partially as incident light 2 on the optical device 100. The incident light is altered by the optical device 100 according to the invention for example bundled and/or concentrated and directed to the sensor device 10.

Figure 4:
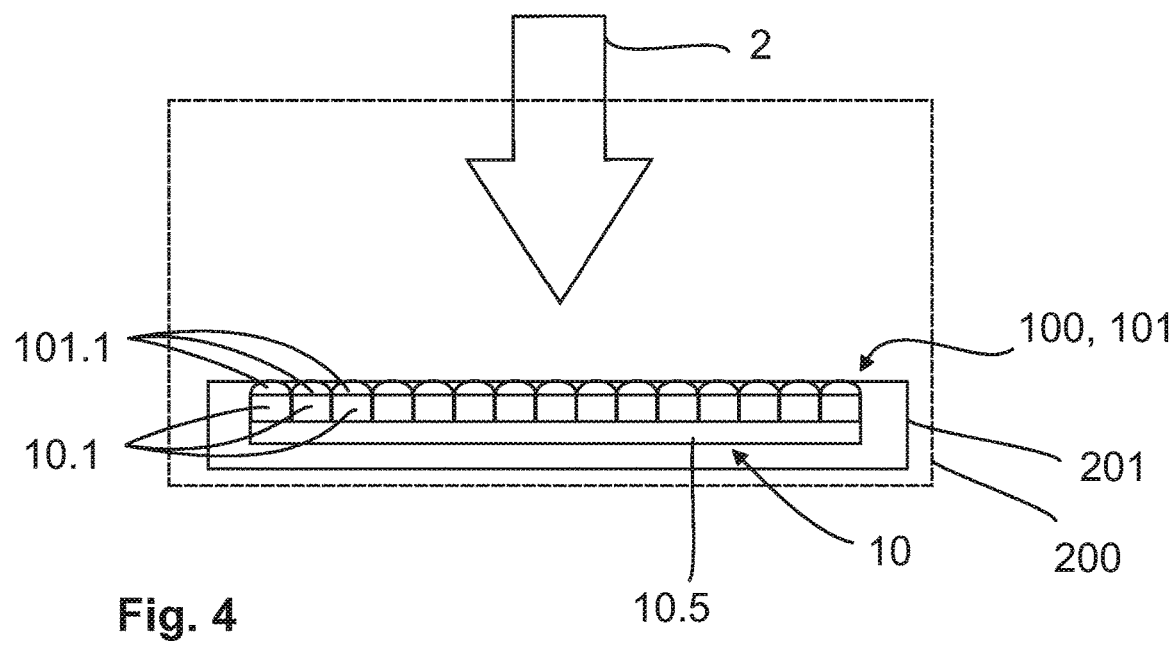

FIG. 4 shows a schematically enlarged representation of the optical device 100 according to the invention, wherein the optical device 100 according to the invention is arranged at the sensor device 10. The sensor device 10 is for example configured as an image acquisition sensor and preferably configures a common and/or singly mountable and/or monolithic component with an optical device 100. Hereby, sensor elements 10.1 of the sensor device 10 and/or the optical device 100 can be arranged and/or assembled on a substrate 10.5 and/or at a circuit board 10.5 of the sensor device 10. This component configured by the sensor device 10 and the optical device 100 configures for example the system 200 according to the invention and can further comprise a housing 210 for mounting and/or for protection of the system 200 according to the invention. It is shown in FIG. 4 that the optical device 100 can be configured as a micro lens array 101 and/or comprises a micro lens array 101. Further, an optical structure 101 or the micro lens array 101 of the optical device 100 comprises a plurality of micro elements 101.1. The micro elements 101.1 are configured preferably as micro lenses 101.1 and are assigned to sensor elements 10.1 of the sensor device 10, respectively. Thereby, in FIG. 4 each micro element 101.1 is assigned to one single sensor element 10.1, respectively, wherein also other ratios are possible. Incident light 2 hits thereby initially on the optical device 100 or the micro element 101.1 and is transferred from the optical device 100 preferably in multiple light bundles. Thereby, particularly each micro element 101.1 can generate a light bundle, respectively, and therewith focus or direct incident light 2 to the sensor element 10.1 assigned to the micro element 101.1, respectively.

Figure 5:
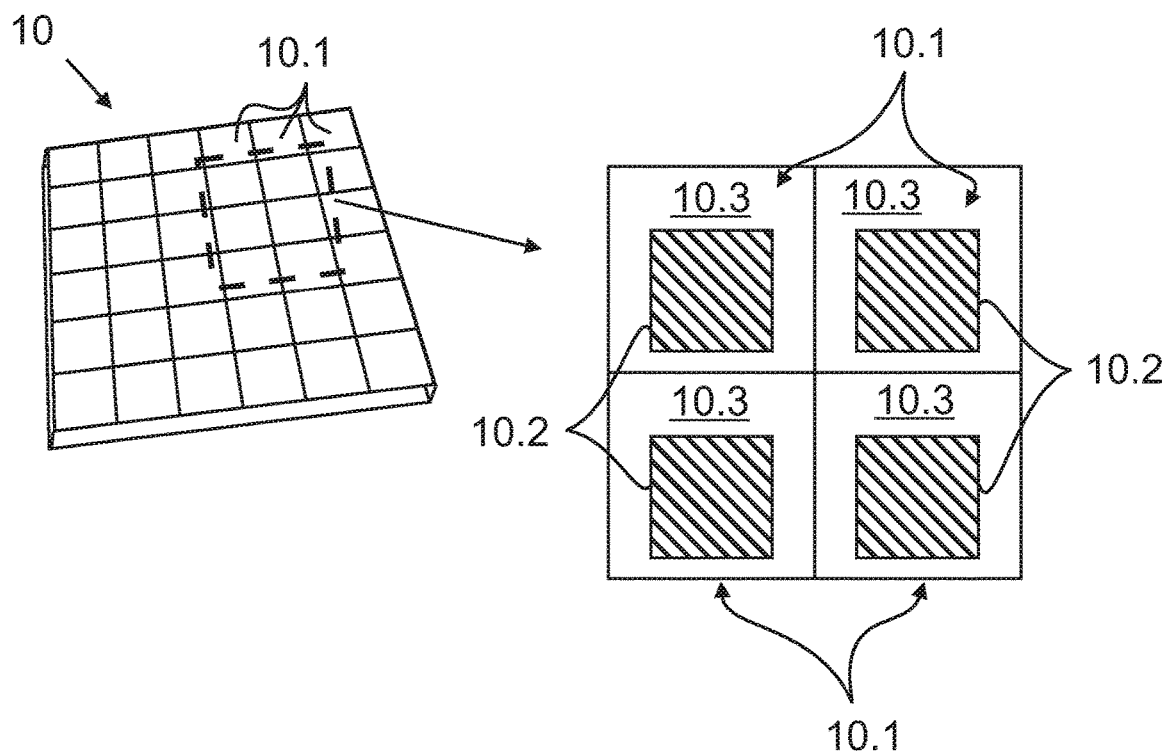

In FIG. 5 an enlarged representation of sensor elements 10.1 of a sensor device 10 (meaning a section with for example 6×6 sensor elements) is shown schematically. Thereby, on the right side of FIG. 5 a schematic top view of four (meaning two columns and two lines or 2×2) sensor elements 10.1 of the sensor device 10 is shown. Each sensor element 10.1 comprises thereby a light active area 10.2 which (directly optically active) serves for image acquisition. This area is shown shaded. The light active areas 10.2 are thereby light sensitive areas for example for transformation of light (particularly infra-red light) in electric energy and comprise for example photo diodes. The photo diodes are for example configured rectangular, squared or polygonal and comprise for example an edge length of 1.4 µm to approx. 20 µm. The remaining area of the sensor elements 10.1 configures a light inactive area 10.3 which cannot be used for image acquisition (by light exposure) and comprises for example cables, electronic and/or only the substrate 10.5 or conducting paths. The smaller the area of the illuminated light active area 10 is in comparison to the illuminated light inactive area 10.3, the smaller is the filling factor and the lower is the light sensitivity of the sensor device 10.

Like shown in FIG. 5, only a certain area of a sensor element 10.1 of the sensor device 10 is light sensitive and can thereby be used for image acquisition. Normally, however the whole area of the sensor element 10.1 is illuminated, wherein a part of the light remains unused. Hereby, the filling factor and the light sensitivity is reduced in relation to the incident light 2. In order to increase the filling factor or the light sensitivity an optical device 100 is used at the sensor device 10 according to the invention. Hereby, the incident light 2 initially hits the optical device 100 or the optical structure 101 which can be configured as a micro lens array 101.

Figure 6:
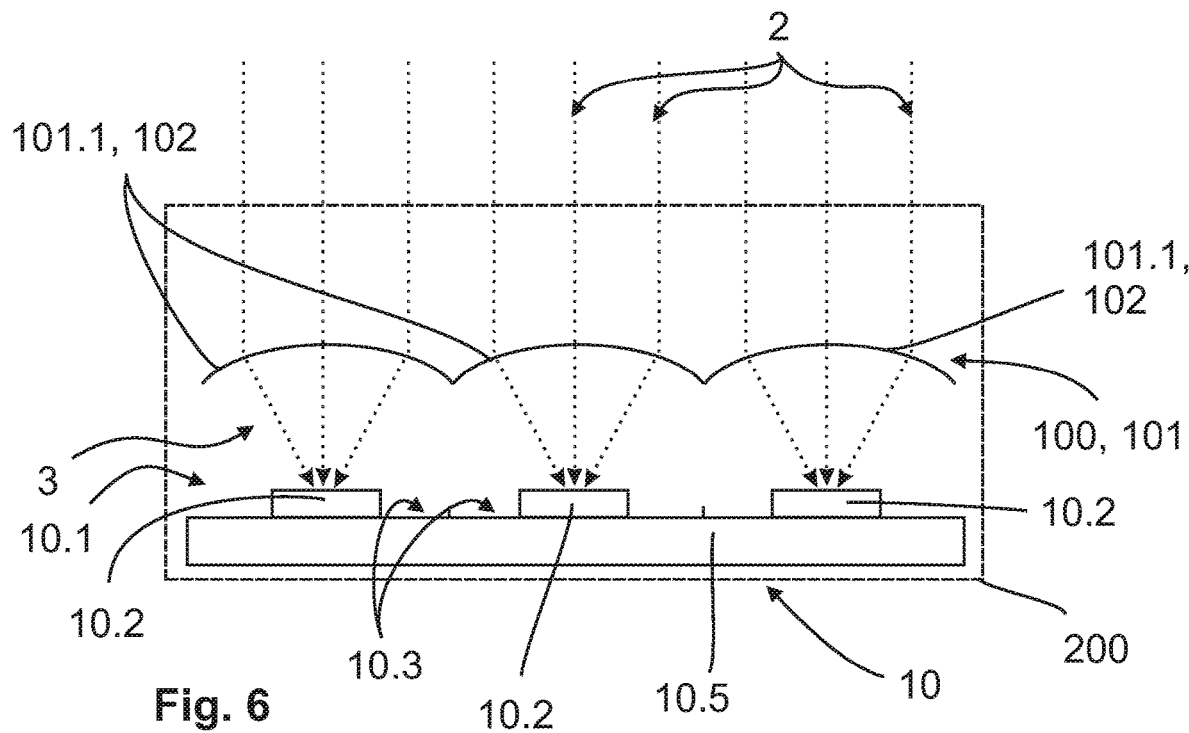

In FIG. 6 it is shown that the light beams of the incident light 2 are broken by the micro elements 101.1 and therewith particularly deflected such that they are directed or focussed as light 3 directed to the sensor elements concentrated on light activating areas 10.2. Hereby, the illumination of the light active areas 10.2 is increased or the illumination of the light inactive areas 10.3 is decreased and more light information can be used for image recognition. Particularly, the breaking of light of the inclining lights 2 occurs at the micro elements 101.1 due to the reflection index of the micro element 101.1 which differs from the refractive index of the material or gas (for example air) outside the micro elements 101.1.

Figures 7, 8:
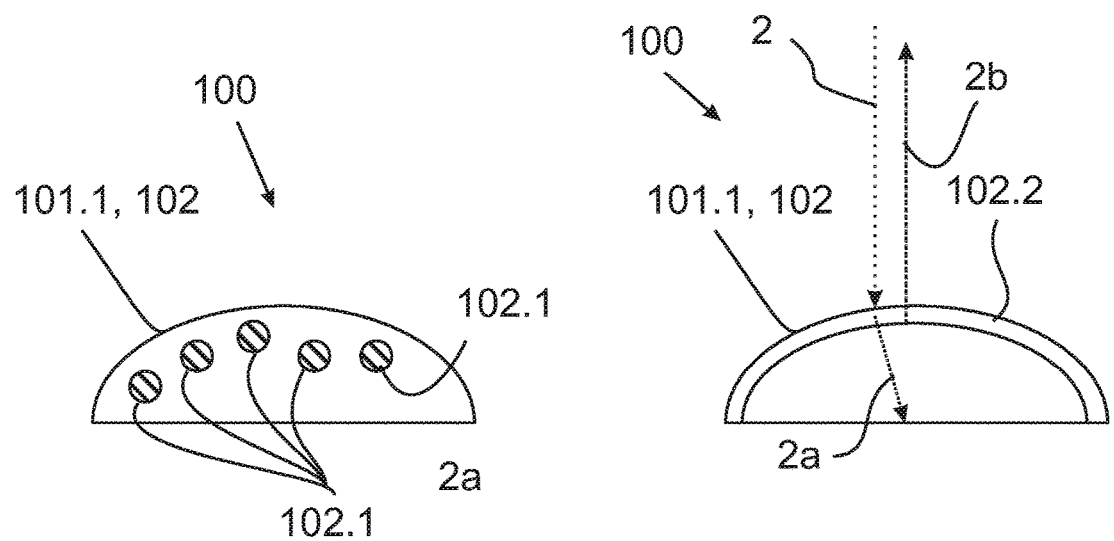

In order to avoid, that with good light conditions (for example by day) a not too big light amount hits on the light active area 10.2 of the sensor element 10.1 and further disturbing light is reduced, the optical device 100 according to the invention can comprise an optical filter 102. The optical filter 102 is thereby configured such that for the image acquisition relevant wavelengths (like for example the wavelengths of a light source 7 and/or an infra-red area) are transmitted and at least an undesired wavelength area like for example visible light is filtered. The filtering occurs for example by an absorption and/or reflection of light in the undesired spectral area. An absorption is for example achieved by that the optical structure 101 of the optical device 100 and/or the micro elements 101.1 with filter materials 102.1, particularly dyes 102.1, doped and/or these comprise filter materials 102.1 like shown in FIG. 7. Likewise, it is possible that the micro elements 101.1 comprise at least a layer 101.2 with a corresponding filter material 102.1 for filtering. The filter materials 102.1 are thereby chosen by that or are configured such that an absorption of light occurs in an undesired spectral area or with an undesired wavelength by the filter material 102.1. The optical filter 102 and/or the filter material 102.1 thereby comprise basically particularly a refraction index and/or an absorption behaviour which differs from the refraction index or absorption behaviour of the micro elements 101.1.

Figure 9:
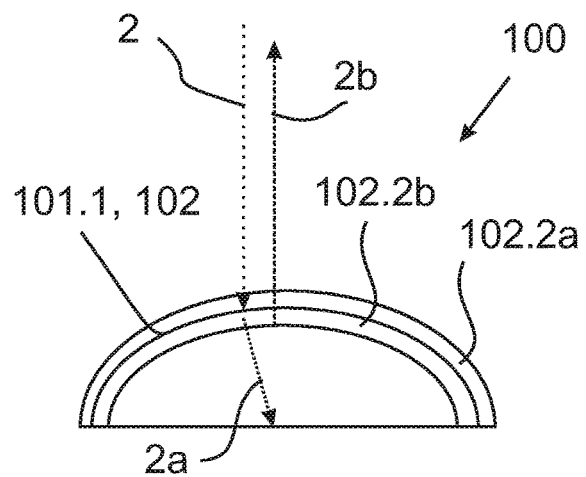

Alternatively and/or additionally a reflection of light can occur in the undesired spectral area or with an undesired wavelength for filtering. Hereby, for example interference filters can be used which are configured as at least one layer 102.2 at the micro element 101.1 of the optical device 100 according to the invention. This if for example shown in FIG. 8, wherein light of a first wavelength 2a is transferred and light of a second wavelength 2b is reflected and therewith filtered. Further, also multiple layers 102.2 can be configured at the micro element 101.1 like for example shown in FIG. 9. Thereby, for example all layers 102.2 can serve as optical filters 102. Further, an additional layer 102.2 for example a first layer 102.2a can comprise a further function. This function can for example be a reduction of undesired reflections such that for example a first layer 102.2a can be configured as anti-reflection coating and the second layer 102.2b can be configured as optical filter 102. The first layer 102.2a and/or the second layer 102.2b can comprise multiple layers respectively in order to increase the degree of filtering and/or anti-reflection function. The anti-reflection coating thereby comprises anti-reflection functions and can therewith particularly reduce the reflection of the incident light 2. Thus, the anti-reflection coating can for example be optimized for a wavelength in the infra-red area (for example 900 nm) and/or for the infra-red area (particularly 900 nm) comprise a reflection degree or reflectivity of below 5% or preferable below 1%. Particularly, the optical filter 102 and particularly the first layer 102.2a of the optical filter 102 comprise a reflection degree which is smaller than the reflection degree of the second layer 102.2b and/or the micro elements 101.1.

Figure 10:
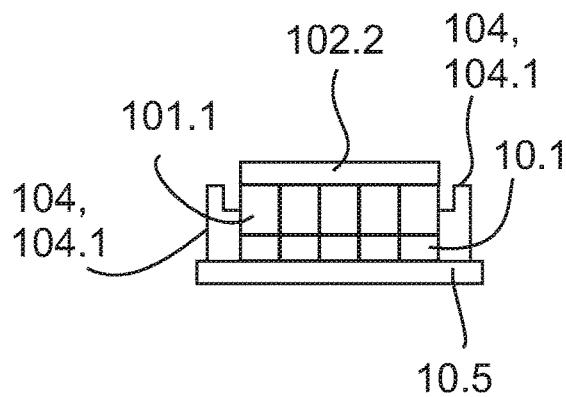

In FIG. 10 a further possible configuration of an optical filter 102 is shown as an optical structure 101. Thus, the optical filter 102 can be arranged as a coating on the optical structure 101 such that incident light 2 initially hits the optical filter 102 and only after the transmission by the optical filter 102 hits the micro elements 101 of the optical device 100 according to the invention. Likewise the optical filter 102 can be configured as a separate unit which is detachable and indetachably connected with the optical structure 101 or the micro elements 101.1. The optical filter 102 can at least comprise a layer and particularly multiple layers, wherein the layer can be configured at least partially as a frequency dependent (interference or absorption) filter and/or at least partially as an anti-reflection filter.

Likewise, a carrier 104 can be intended, particularly a support element 104, which is arranged for example at one side, at both sides or at each side of the optical structure 101. The carrier 104 thereby serves for the arrangement and stabilisation of the optical structure 101, wherein the carrier 104 is particularly configured such that also with a heat extension of the carrier 104 the optical structure remains fixed at the same position. This is preferably affected by at least a compensation element 104.1 of the carrier 104 with an (angled) structure which preferably is configured such that a heat extension in a first direction of a first structure of the compensation element 104.1 is compensated by a heat extension in a (particularly opposing) second direction of a second structure of the compensation element 104.1.

Figure 11:
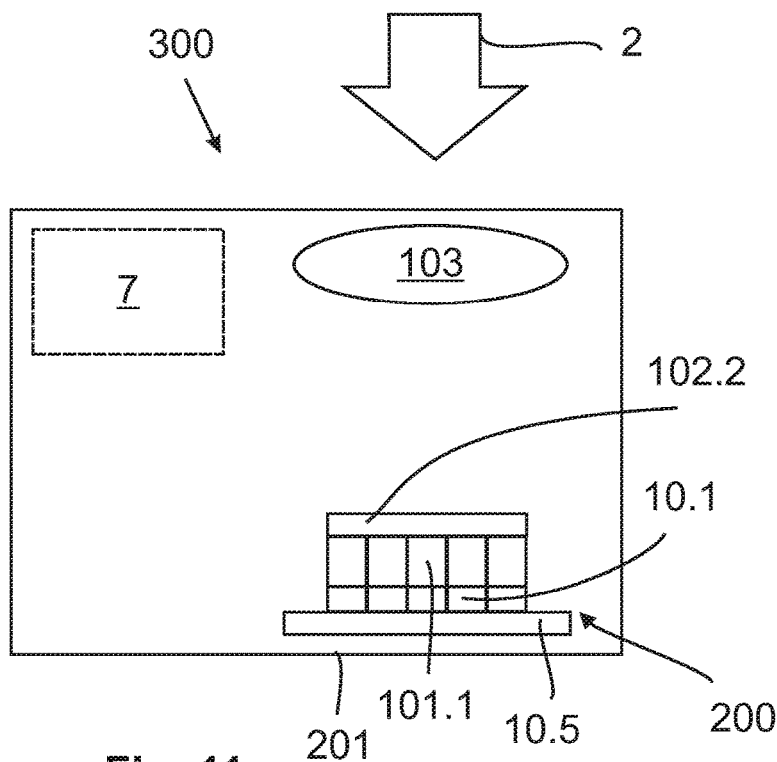

In FIG. 11 a further embodiment of a system 200 according to the invention with an optical device 100 according to the invention is shown, wherein the system 200 according to the invention is configured together with a light source 7 as a mounting module 300 according to the invention. Further, an additional optic 103 is intended, wherein incident light 2 initially is reflected by the optic 103 and/or bundled and subsequently is directed to the optical device 100 according to the invention by the optic 103. The optic 103 can thereby for example be configured as a converting lens.

Figure 12:
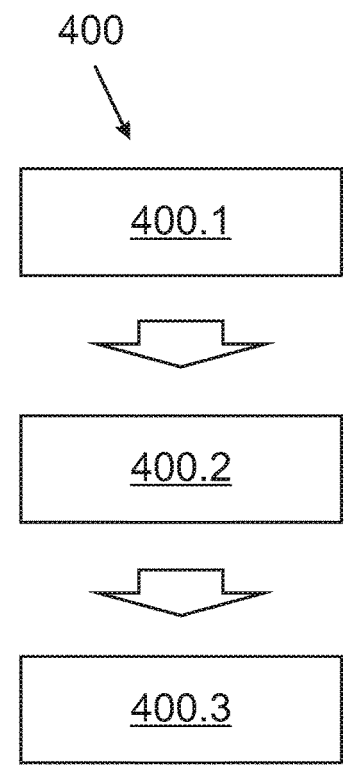

In FIG. 12 method steps of the method according to the invention are visualized schematically. Thereby, according to a first method step 400.1 incident light 2 hits initially an optical filter 200 of a device 100 according to the invention, wherein particularly visible light is blocked or filtered and particularly visible light is suppressed in contrast to the infra-red area. According to a second method step 400.2 subsequently the filtered light hits optical micro elements 101.1 of the optical device 100 and is thereby bundled such that light subsequently according to the third method step 400.3 is concentrated on light active areas 10.2 of the sensor elements 10.1.

The previous descriptions of the different embodiments describe the present invention only within the scope of examples. Naturally, single features of the embodiments as far as technical meaningful can be freely combined with one another without leaving the scope of the present invention.

REFERENCE LIST

1 Vehicle
1.1 Control electronic
2 Incident light
2a Light of a first wavelength
2b Light of a second wavelength
3 Light directed to sensor elements
4 User
5 Detection area
6 Identification device
7 Light source
7.1 Laser diode
7.2 Widening optic
10 Sensor device, image acquisition sensor
10.1 Sensor element, pixels
10.2 Light active area
10.3 Light inactive area
10.5 Sensor substrate, circuit board
100 Optical device
101 Optical structure, micro lens array
101.1 Micro elements, micro lenses
102 Optical filter
102.1 Filter material, dye
102.2 Layers
102.2a First layers
102.2b Second layers
103 Optic
104 Carrier, support element
104.1 Compensation element
200 System
201 Housing
300 Mounting module
310 Control and evaluation device
400 Method
400.1 First method step
400.2 Second method step
400.3 Third method step

What is claimed is:

1. An optical device for exposure of a sensor device for a vehicle with an optical structure which comprises an arrangement of optical micro elements in order to bundle incident light by the optical micro elements and direct the light to sensor elements of the sensor device respectively, wherein the optical structure is configured such that light which is directed to the sensor elements is concentrated for light active areas of the sensor elements, wherein the sensor device is electrically connected with a control or evaluation device and is controlled in a clocked manner such that time-of-flight recordings are performed, wherein a detection area (5) is monitored by the sensor device, wherein the detection area (5) is located outside the vehicle (1), in order to determine a proximity and a gesture of a user (4) and wherein in case of a detection of the proximity and the gesture of the user, a function of the vehicle (2) is triggered, wherein the gesture detection is conducted by the control or evaluation device based on image information captured by the sensor device, wherein the proximity detection is a distance detection performed by measurement of the time of flight of the light, conducted by the control or evaluation device through a synchronized activation of a light source and the sensor device (10), and wherein recognition and evaluation of gestures of the user (4) is conducted by acquisition and comparison of a plurality of images, the images acquisition is initiated by the sensor device (10) caused by an approach of the user (4) or by a detection of an identification device (6).

2. The optical device according to claim 1, wherein the optical micro elements are configured at least as micro lenses or the optical structure is configured as a micro lens array or the micro elements are arranged matrix-like.

3. The optical device according to claim 1, wherein an optical filter is intended for the selection of the incident light in relation to the wavelength.

4. The optical device according to claim 1, wherein an optical filter is intended for filtering predefined wavelengths of the incident light and is designed as an infrared filter to block visible light.

5. The optical device according to claim 1, wherein an optical filter is intended with the optical structure.

6. The optical device according to claim 1, wherein the optical structure, are configured as optical.

7. The optical device according to claim 1, wherein the micro elements comprise layers.

8. The optical device according to claim 1, wherein at least 10×10 or 20×20 or 30×30 or 50×50 micro elements, are arranged in the optical structure.

9. The optical device according to claim 1, wherein the micro elements are configured from a plastic.

10. The optical device according to claim 1, wherein the micro elements comprise at least acryl or epoxy resin or quartz glass or silicon or germanium or zinc sulphide or zinc selenide or gallium phosphide or gallium arsenide.

11. The optical device according to claim 1, wherein the optical structure is fixated to the sensor device by a carrier.

12. The optical device according to claim 1, wherein said optical structure is fixated to the sensor device by a carrier or by a support element, wherein the carrier or the support element comprises a compensation element which is configured to compensate at least a heat extension of the carrier or of the support element.

13. The optical device according to claim 1, wherein the sensor device is clocked controllable by the control or evaluation device for performing the time-of-flight recordings.

14. The optical device according to claim 1, wherein the sensor device is configured to perform the time-of-flight recordings and therewith measure a time between an emission and received reflected light, whereby the sensor device is connected via the control or evaluation device with a light source, and the sensor device is time controlled from the control or evaluation unit, wherein the control or evaluation device affects a gesture recognition due to an image information of the sensor device.

15. The optical device according to claim 1, wherein the triggered function of the vehicle (2) is an identification check performed within a scope of a passive and/or active keyless entry system, an wake-up signal being transmitted to the identification device which the user carries with him when a certain gesture is detected, and wherein the triggered function is opening a hatch-flap and/or opening doors of the vehicle (2).

16. The optical device according to claim 1, wherein the optical structure is further configured to increase light reaching light active areas of the sensor device and decrease light reaching light inactive areas of the sensor device by concentrating light which is directed to the sensor elements on the light active areas of the sensor elements.

17. A system with a sensor device for a vehicle and at least an optical device for the exposure of the sensor device, wherein the optical device comprises an optical structure which comprises an arrangement of optical micro elements in order to bundle incident light by the optical micro elements and direct the light to sensor elements of the sensor device respectively, wherein the optical structure is configured such that light directed to the sensor elements is concentrated for light active areas of the sensor elements, wherein the sensor device is electrically connected with a control or evaluation device and is controlled in a clocked manner such that time-of-flight recordings are performed, wherein a detection area (5) is monitored by the sensor device, wherein the detection area (5) is located outside the vehicle (1), in order to determine a proximity and a gesture of a user (4) and wherein in case of a detection of the proximity and the gesture of the user, a function of the vehicle (2) is triggered, wherein the gesture detection is conducted by the control or evaluation device based on image information captured by the sensor device, wherein the proximity detection is a distance detection performed by measurement of the time of flight of the light, conducted by the control or evaluation device through a synchronized activation of a light source and the sensor device (10), and wherein recognition and evaluation of gestures of the user (4) is conducted by acquisition and comparison of a plurality of images, the images acquisition is initiated by the sensor device (10) caused by an approach of the user (4) or by a detection of an identification device (6).

18. The system according to claim 17, wherein the optical structure configures at least a unit with the sensor device or is integrated on the sensor device and preferably is arranged relative to the sensor device such that incident light from outside is directed to the optical structure and through the optical structure to the sensor element.

19. The system according to claim 17, wherein the sensor device is at least an image recognition device or an image sensor, wherein the sensor elements are configured at least as photo sensitive pixels or as a matrix or are arranged adjacently.

20. The system according to claim 17, wherein the sensor elements comprise the light active area and a light inactive area, wherein only the light active area is at least configured photo sensitive or is used for image recognition.

21. The system according to claim 17, wherein the sensor device is at least configured as a CMOS sensor or as a CCD sensor or as a LDPD sensor.

22. The system according to claim 17, wherein at least one light source is intended for the emission of at least light pulses or a continuous radiation and an optical filter of the optical device are intended, wherein the filter properties of the optical filter are adjusted to the wavelength of the light emitted from the light source.

23. A method for exposure of a sensor device for a vehicle with an optical device, wherein an optical structure of the optical device comprises an arrangement of optical micro elements and incident light is bundled by the optical micro elements and directed to sensor elements of the sensor device, respectively, wherein by the optical structure the light directed to the sensor elements is concentrated for light active areas of the sensor elements, wherein the sensor device is electrically connected with a control or evaluation device and is controlled in a clocked manner such that time-of-flight recordings are performed, wherein a detection area (5) is monitored by the sensor device, wherein the detection area (5) is located outside the vehicle (1), in order to determine a proximity and a gesture of a user (4) and wherein in case of a detection of the proximity and the gesture of the user, a function of the vehicle (2) is triggered
   wherein the gesture detection is conducted by the control or evaluation device based on image information captured by the sensor device,
   wherein the proximity detection is a distance detection performed by measurement of the time of flight of the light, conducted by the control or evaluation device through a synchronized activation of a light source and the sensor device (10), and
wherein recognition and evaluation of gestures of the user (4) is conducted by acquisition and comparison of a plurality of images, the images acquisition is initiated by the sensor device (10) caused by an approach of the user (4) or by a detection of an identification device (6).

24. The method according to claim 23, wherein a filtering of the incident light occurs wavelength dependent by an optical filter by at least absorption or by reflection.

25. The method according to claim 23, wherein the micro elements bundle incident light and at least direct or focus the light to determined areas of the sensor device respectively.

26. The method according to claim 23, wherein the at least a control or evaluation device controls the sensor device and/or a pulsed light source, to perform the time-of-flight recordings.

27. A method for exposure of a sensor device for a vehicle with an optical device, wherein an optical structure of the optical device comprises an arrangement of optical micro elements and incident light is bundled by the optical micro elements and directed to sensor elements of the sensor device, respectively, wherein by the optical structure the light directed to the sensor elements is concentrated for light active areas of the sensor elements, wherein the sensor device is electrically connected with a control or evaluation device and controlled in a clocked manner such that time-of-flight recordings are performed, wherein a detection area (5) is monitored by the sensor device, wherein the detection area (5) is located outside the vehicle (1), in order to determine a proximity or gesture of a user (4) and wherein in case of a detection of the proximity or gesture of the user, a function of the vehicle (2) is triggered
   wherein the gesture detection is conducted by the control or evaluation device based on the image information captured by the sensor device,
   wherein the proximity detection is a distance detection performed by measurement of the time of flight of the light, conducted by the control or evaluation device through a synchronized activation of a light source and the sensor device (10), and
wherein recognition and evaluation of gestures of the user (4) is conducted by acquisition and comparison of a plurality of images, the images acquisition is initiated by the sensor device (10) caused by an approach of the user (4) or by a detection of an identification device (6);
   wherein image recognition of images acquired by the sensor device is conducted by the at least a control or evaluation device, which combines a number of images acquired by the sensor device according to a light amount.

28. An optical device for exposure of a sensor device for a vehicle with an optical structure which comprises an arrangement of optical micro elements in order to bundle incident light by the optical micro elements and direct the light to sensor elements of the sensor device respectively, wherein the optical structure is configured such that light which is directed to the sensor elements can be concentrated for light active areas of the sensor elements, wherein the sensor device is electrically connected with a control or evaluation device and can be controlled in a clocked manner such that time-of-flight recordings are performed,
   wherein a detection area (5) is monitored by the sensor device, wherein the detection area (5) is located outside the vehicle (1), in order to determine a proximity or gesture of a user (4) and wherein in case of a detection of the proximity or gesture of the user, a function of the vehicle (2) is triggered,
   wherein the gesture detection is conducted by the control or evaluation device based on the image information captured by the sensor device,
   wherein the proximity detection is a distance detection performed by measurement of the time of flight of the light, conducted by the control or evaluation device through a synchronized activation of a light source and the sensor device (10), and
   wherein recognition and evaluation of gestures of the user (4) is conducted by acquisition and comparison of a plurality of images, the images acquisition is initiated by the sensor device (10) caused by an approach of the user (4) or by a detection of an identification device (6);
   wherein the control or evaluation device (310) combines a number of image recordings acquired by the sensor device (10) for evaluation, wherein the number of the image recordings depends on an amount of light.

\* \* \* \* \*